(12) United States Patent
Orii et al.

(10) Patent No.: US 8,794,250 B2
(45) Date of Patent: Aug. 5, 2014

(54) SUBSTRATE PROCESSING METHOD AND SUBSTRATE PROCESSING APPARATUS

(71) Applicant: Tokyo Electron Limited, Tokyo (JP)

(72) Inventors: Takehiko Orii, Tokyo (JP); Kenji Sekiguchi, Tokyo (JP); Noritaka Uchida, Tokyo (JP); Satoru Tanaka, Tokyo (JP); Hiroki Ohno, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/693,712

(22) Filed: Dec. 4, 2012

(65) Prior Publication Data

US 2013/0145643 A1 Jun. 13, 2013

Related U.S. Application Data

(62) Division of application No. 11/578,099, filed as application No. PCT/JP2005/018770 on Oct. 12, 2005, now Pat. No. 8,337,659.

(30) Foreign Application Priority Data

Oct. 12, 2004 (JP) ................................. 2004-297784

(51) Int. Cl.
*H01L 21/306* (2006.01)
*C23F 1/00* (2006.01)
*G11B 31/00* (2006.01)

(52) U.S. Cl.
USPC .............................. 134/114; 134/902; 34/357

(58) Field of Classification Search
USPC ..................... 134/902, 114; 34/357
See application file for complete search history.

(56) References Cited

U.S. PATENT DOCUMENTS

| 5,882,433 A | 3/1999 | Ueno |
| 5,882,466 A | 3/1999 | Grootaert et al. |
| 6,004,047 A | 12/1999 | Akimoto et al. |

(Continued)

FOREIGN PATENT DOCUMENTS

| JP | 02-046728 | 2/1990 |
| JP | 04-179227 | 6/1992 |

(Continued)

OTHER PUBLICATIONS

Supplementary European Search Report for Application No. EP 05 79 3595 issued Jul. 14, 2009.

(Continued)

*Primary Examiner* — Sylvia R MacArthur
(74) *Attorney, Agent, or Firm* — Smith, Gambrell & Russell, LLP

(57) ABSTRACT

A substrate processing apparatus according to the present invention is provided with a spin chuck (3) that holds a substrate (W) and rotates the same. A process liquid supply system (11, ...) is disposed to supply a process liquid to the substrate rotated by the spin chuck. There are disposed a fluid nozzle (12) that supplies to the substrate a drying fluid having a higher volatility than that of the process liquid, and an inert gas nozzle (13) that supplies an inert gas to the substrate. A nozzle moving mechanism (15, 52, ...) is disposed that moves the nozzles (12, 13) radially outward relative to a rotational center (Po) of the substrate, while maintaining the inert gas nozzle nearer to the rotational center of the substrate than the fluid nozzle.

7 Claims, 7 Drawing Sheets

(56) References Cited

U.S. PATENT DOCUMENTS

| | | | |
|---|---|---|---|
| 6,092,937 | A | 7/2000 | Snodgrass et al. |
| 6,247,479 | B1 | 6/2001 | Taniyama et al. |
| 6,333,275 | B1 | 12/2001 | Mayer et al. |
| 6,491,764 | B2 | 12/2002 | Mertens et al. |
| 6,834,440 | B2 | 12/2004 | Lee |
| 6,863,741 | B2 | 3/2005 | Orii et al. |
| 7,017,281 | B2 | 3/2006 | Izumi |
| 7,543,593 | B2 | 6/2009 | Orii et al. |
| 2001/0004878 | A1 | 6/2001 | Sakai et al. |
| 2002/0007844 | A1 | 1/2002 | Orii et al. |
| 2006/0123658 | A1 | 6/2006 | Izumi |
| 2007/0017555 | A1 | 1/2007 | Sekiguchi et al. |
| 2007/0131256 | A1 | 6/2007 | Nanba et al. |
| 2007/0223342 | A1 | 9/2007 | Orii et al. |
| 2008/0093340 | A1 | 4/2008 | Nakamori et al. |
| 2013/0145643 | A1 * | 6/2013 | Orii et al. .................. 34/357 |

FOREIGN PATENT DOCUMENTS

| | | |
|---|---|---|
| JP | 6-9130 | 2/1994 |
| JP | 09-038595 | 2/1997 |
| JP | 9-38595 | 2/1997 |
| JP | 09-069488 | 3/1997 |
| JP | 9-293702 | 11/1997 |
| JP | 11-233481 | 8/1999 |
| JP | 2000-058498 | 2/2000 |
| JP | 2001-053051 | 2/2001 |
| JP | 2002-057088 | 2/2002 |
| JP | 2002-110612 | 4/2002 |
| JP | 2003-197590 | 7/2003 |
| JP | 2003-229404 | 8/2003 |
| JP | 2004-95805 | 3/2004 |
| JP | 2005-159191 | 6/2005 |
| WO | 03/007348 | 1/2003 |
| WO | 2005/050724 | 6/2005 |

OTHER PUBLICATIONS

PCT Second and Supplementary Notice Informing the Applicant of the Communication of the International Application (Form PCT/IB/308) (Second and Supplementary Notice) in connection with PCT/JP2005/018770, dated Jan. 2004.

International Search Report ( PCT/ISA/210) dated Jun. 27, 2006.

PCT Notification of Transmittal of Translation of the International Preliminary Examination Report (Form PCT/IB/338) dated Jan. 2004.

PCT International Preliminary Report on Patentability (Form PCT/IB/373) dated Jan. 2004.

PCT Written Opinion of the International Searching Authority (Form/ISA/237) dated Apr. 2005.

Japanese Office Action issued on May 14, 2009 for Japanese Patent Application No. 2005-283390 with English translation.

Japanese Office Action issued on Jan. 19, 2010 for Japanese Patent Application No. 2005-380090 with English translation.

Notification of Reasons for Rejection issued on Jan. 23, 2009.

Japanese Office Action issued on Dec. 9, 2011 for Application No. 2009-254293 with English translation.

Machine generated English Translation of JP2001-053051 to Fujita Takumi et al., published Feb. 23, 2001.

Machine Generated Translation of JP2002-057088, published Feb. 22, 2002.

Notification of Transmittal of Translation of the International Preliminary Report on Patentability (Form PCT/IB/338) in connection with PCT/JP2005/018770, dated Jan. 2004.

International Preliminary Report on Patentability (Form PCT/IB/373) in connection with PCT/JP2005/018770, dated Jan. 2004.

Translation of Written Opinion (Form PCT/ISA/237) in connection with PCT/JP2005/018770, dated Jan. 2004.

* cited by examiner

SUBSTRATE PROCESSING METHOD AND SUBSTRATE PROCESSING APPARATUS

CROSS REFERENCE TO RELATED APPLICATION

This application is a division of Ser. No. 11/578,099 filed on Oct. 10, 2006, which is a 371 National Phase of PCT/JP2005/018770, filed Oct. 12, 2006, which claims priority from JP 2004-297784, filed Oct. 12, 2004, which all are being incorporated in their entirety herein by reference.

FIELD OF THE INVENTION

The present invention relates to a technique for drying a substrate such as a semiconductor wafer which has been subjected to a liquid process and a cleaning process, with the use of process liquids.

BACKGROUND ART

When manufacturing a semiconductor device, a processing apparatus is used for cleaning, with the use of a chemical liquid, a semiconductor wafer (referred to as "wafer" below) held by a spin chuck. In a cleaning step performed by such an apparatus, a process liquid such as a deionized water is supplied to a wafer, and thereafter the wafer is rotated to remove liquid droplets therefrom due to the centrifugal force, so that the wafer is dried.

Conventional methods for drying a wafer include methods for spraying a rotating wafer with an IPA (isopropyl alcohol) vapor, spraying a rotating wafer with an atomized IPA, and supplying an IPA liquid to a rotating wafer. Another method for drying a wafer is, while supplying a deionized water to a wafer from a nozzle that radially moves outward from a rotational center of the wafer, to supply an IPA vapor to the wafer at a position nearer to the rotational center than a position at which the deionized water is supplied (JP 11-233481A and JP 2003-197590A). There has been proposed another method for drying a wafer in which, while a deionized water is supplied to a wafer, an inert gas is sprayed onto the wafer at a position nearer to a rotational center of the wafer than a position at which the deionized water is supplied (JP2001-53051A).

However, the conventional methods for drying a wafer by supplying a drying process liquid, such as IPA, are disadvantageous in that a large amount of process liquid is consumed.

SUMMARY OF THE INVENTION

The object of the present invention is to provide a substrate processing method and a substrate processing apparatus that are capable of reliably drying a substrate, while reducing a consumption of drying process liquid such as IPA. Another object of the present invention is to provide a storage medium that stores therein a program configured to execute the processing method.

In order to solve the above problems, the present invention provides a substrate processing method comprising:

a liquid-processing step of processing a substrate by a process liquid; and a drying step of drying the substrate by supplying to the substrate a drying fluid having a higher volatility than that of the process liquid and an inert gas, while rotating the substrate with the process liquid adhering thereto; wherein at the drying step, a supply position of the fluid to the substrate and a supply position of the inert gas to the substrate are moved radially outward relative to a rotational center of the substrate, respectively, while maintaining the supply position of the inert gas nearer to the rotational center of the substrate than the supply position of the fluid.

In the method, it is preferred that the liquid-processing step and the drying step are successively performed radially outward relative to the rotational center of the substrate, by supplying the process liquid to the substrate while moving a supply position of the process liquid to the substrate radially outward relative to the rotational center of the substrate, with maintaining the supply position of the process liquid farther away from the rotational center of the substrate than the supply position of the fluid to the substrate.

In the method, it is preferred that the supply position of the inert gas to the substrate is positioned ahead of the supply position of the fluid to the substrate, in a rotational direction of the substrate.

In the method it is preferred that the drying step is performed under conditions that a humidity around the substrate is lower than that at the liquid-processing step.

Further, the present invention provides a substrate processing apparatus comprising:

a spin chuck configured to hold a substrate and rotate the same;

a process liquid supply system configured to supply a process liquid to the substrate rotated by the spin chuck;

a fluid nozzle configured to supply a drying fluid having a higher volatility than that of the process liquid;

an inert gas nozzle configured to supply an inert gas to the substrate; and a nozzle moving mechanism configured to move the fluid nozzle and the inert gas nozzle radially outward relative to a rotational center of the substrate, while maintaining the inert gas nozzle nearer to the rotational center of the substrate than the fluid nozzle.

In the apparatus, it is preferred that an opening dimension of the inert gas nozzle is larger than an opening dimension of the fluid nozzle, in a direction (herein, the direction in parallel to a surface of the substrate) perpendicular to a moving direction of the nozzles moved by the nozzle moving mechanism.

The process liquid supply system may include:

a process liquid nozzle configured to supply the process liquid to the substrate; and a nozzle moving mechanism configured to move the process liquid nozzle radially outward relative to the rotational center of the substrate, while maintaining the process liquid nozzle farther away from the rotational center of the substrate than the fluid nozzle.

Preferably, the apparatus further comprises a humidity adjusting mechanism configured to adjust a humidity around the substrate held by the spin chuck.

For example, the drying fluid is selected from the group consisting of an IPA liquid, an IPA solution diluted with water, a mist of IPA liquid, a mist of IPA solution diluted with water, an IPA vapor, and a vapor of IPA solution diluted with water. Namely, the "drying fluid having a higher volatility than that of the process liquid" is a concept including not only a liquid having a higher volatility than that of the process liquid, but also a vapor of such a liquid.

The process liquid is a rinse liquid such as deionized water.

Furthermore, the present invention provides a storage medium for storing a program configured to execute a substrate processing method comprising:

a liquid-processing step of processing the substrate by a process liquid; and a drying step of drying the substrate by supplying to the substrate a drying fluid having a higher volatility than that of the process liquid and an inert gas, while rotating the substrate with the process liquid adhering thereto; wherein at the drying step, a supply position of the fluid to the substrate and a supply position of the inert gas to the substrate are moved radially outward relative to a rotational center of the substrate, respectively, while maintaining the supply position of the inert gas nearer to the rotational center of the substrate than the supply position of the fluid.

In the storage medium, it is preferred that, in the substrate processing method, the liquid-processing step and the drying step are successively performed radially outward relative to the rotational center of the substrate, by supplying the process liquid to the substrate while moving a supply position of the process liquid to the substrate radially outward relative to the rotational center of the substrate, with maintaining the supply position of the process liquid farther away from the rotational center of the substrate than the supply position of the fluid to the substrate.

According to the present invention, a substrate can be efficiently dried by simultaneously supplying to the substrate a drying fluid such as IPA solution, and nitrogen gas. That is, since the nitrogen gas promotes drying of the substrate, the amount of the drying fluid to be used can be lessened to achieve a reduction in cost. In addition, a time required for processing a substrate can be shortened. Moreover, generation of water marks on a surface of a substrate can be effectively prevented.

PREFERRED EMBODIMENTS OF THE INVENTION

Preferred embodiments of the present invention will be described hereinbelow, based on a substrate processing apparatus for cleaning a surface of a substantially disk-shaped wafer W as a substrate.

Figure 1:
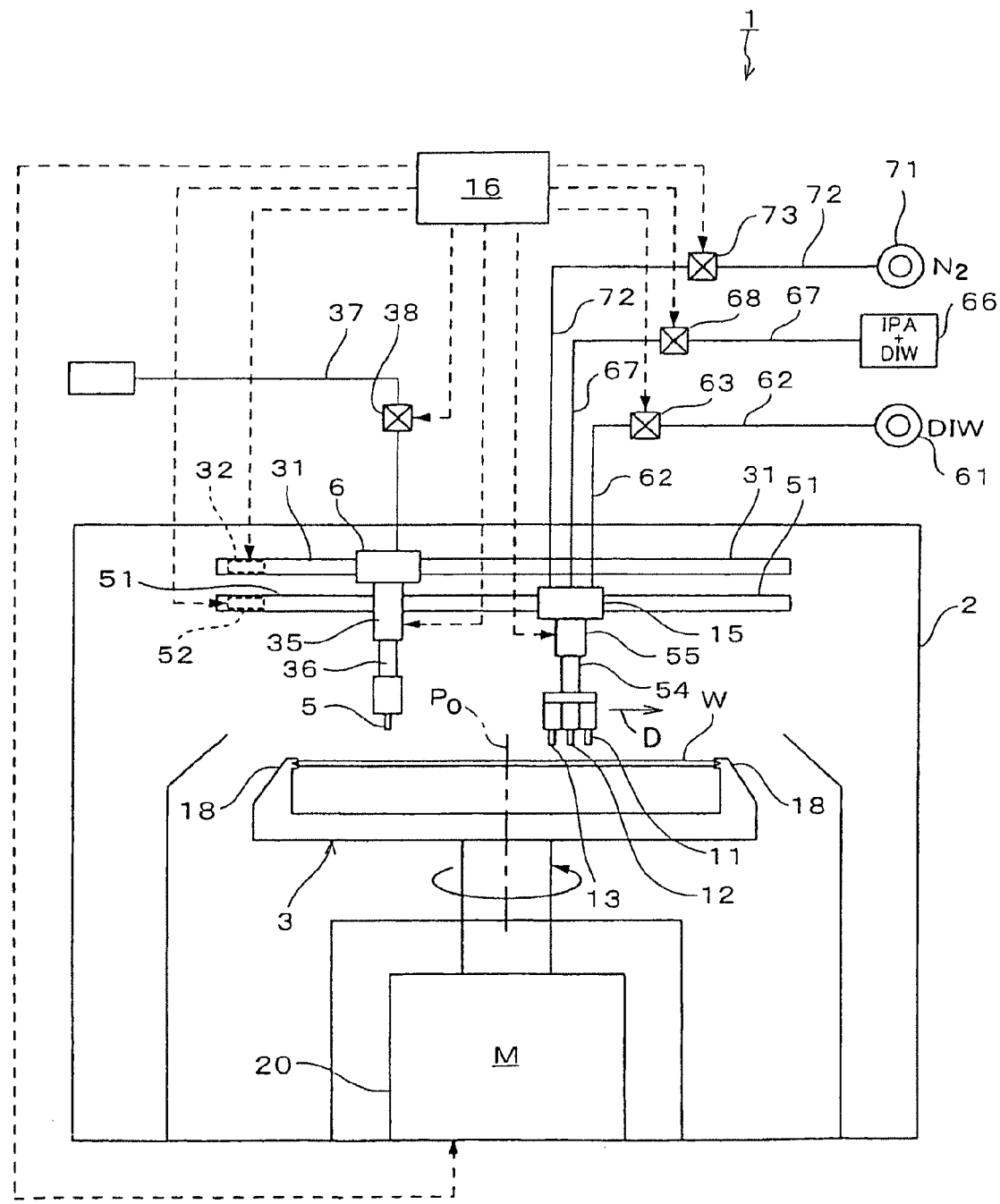
FIG. 1 is a schematic view of a substrate processing apparatus according to the present invention.

As shown in FIG. 1, a substrate processing apparatus 1 in this embodiment includes a process vessel 2 in which a spin chuck 3 is disposed to substantially horizontally hold the wafer W and rotate the same. There is disposed a chemical liquid nozzle 5 for supplying a chemical liquid to the wafer W. The chemical liquid nozzle 5 is supported by a first support arm 6. There are disposed a process liquid nozzle 11 for supplying a rinse liquid as a process liquid, a fluid nozzle 12 for supplying a drying fluid having a higher volatility than that of the rinse liquid, and an inert gas nozzle 13 for supplying nitrogen ($N_2$) gas as an inert gas. The nozzles 11, 12, and 13 are supported by a second support arm 15. A controller 16 including a CPU is disposed to control the respective elements of the substrate processing apparatus 1.

Three holding members 18 are disposed above the spin chuck 3. The holding members 18 are adapted to be in contact with a periphery of the wafer W at three points so as to hold the wafer W. A motor 20 is disposed below the spin chuck 3 to rotate the same through a vertical rotational shaft. When the spin chuck 3 is rotated by the motor 20, the wafer W together with the spin chuck 3 is rotated in substantially a horizontal plane about a center Po of the wafer W. Driving of the motor 20 is controlled by the controller 16.

Figure 2:
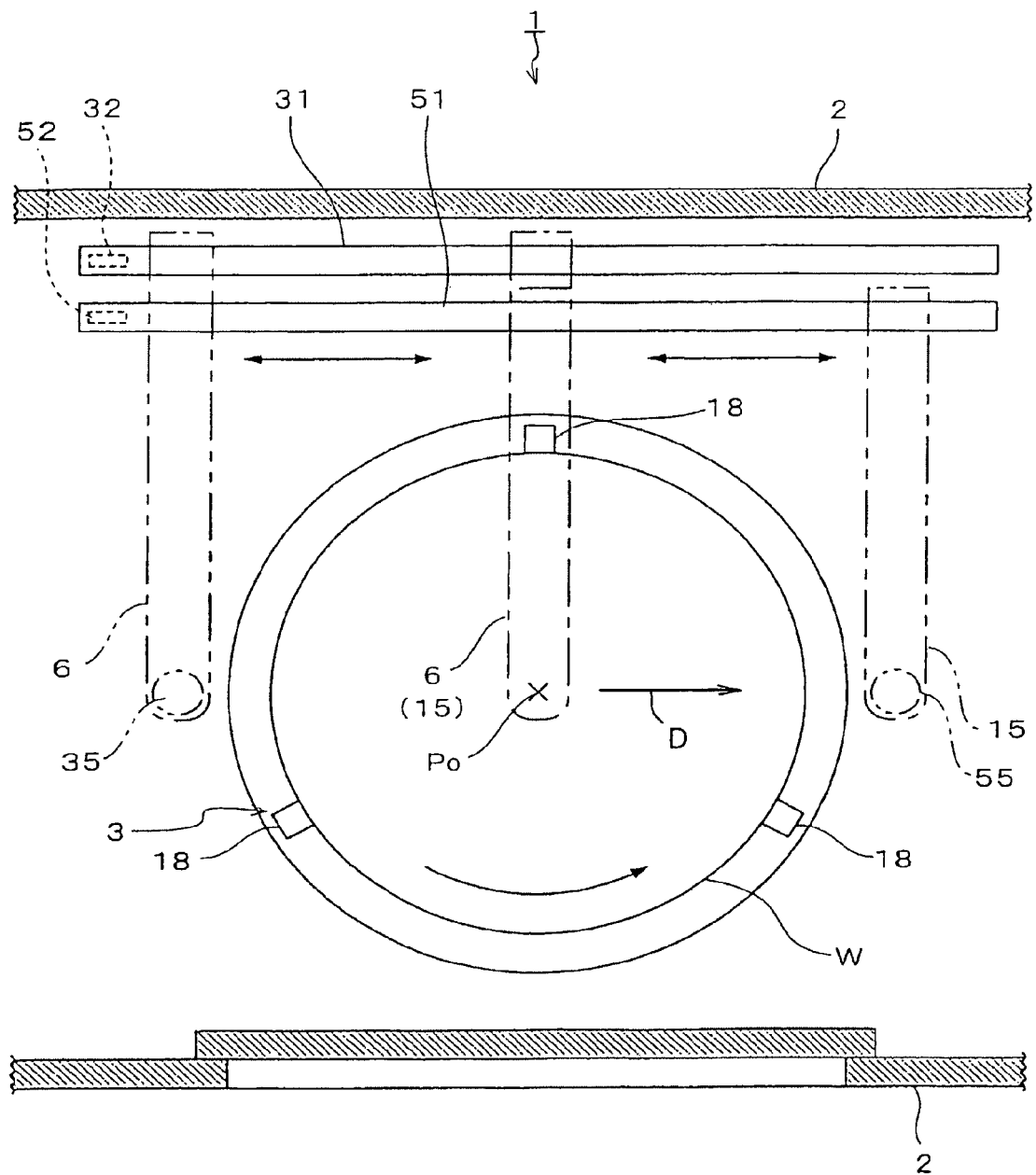
FIG. 2 is a horizontal cross sectional view of a main part of the substrate processing apparatus shown in FIG. 1.

The first support arm 6 is disposed above the wafer W supported by the spin chuck 3. A proximal end of the support arm 6 is supported to be capable of moving along a guide rail which is substantially horizontally placed. A driving mechanism 32 is disposed for moving the support arm 6 along the guide rail 31. As shown in FIG. 2, along with a movement of the first support arm 6 which is driven by the driving mechanism 32, the chemical liquid nozzle 5 can horizontally, radially move outside the wafer W relative to the rotational center Po of the wafer W. Driving of the driving mechanism 32 is controlled by the controller 16 (FIG. 1).

As shown in FIG. 1, the chemical liquid nozzle 5 is attached to a lower end of an elevating shaft 36 extending downward from an elevating mechanism 35 that is fixed on a distal end of the first support arm 6. The elevating shaft 36 is capable of vertically moving by the elevating mechanism 35, such that a position of the liquid nozzle 5 is set at a given height. Driving of the elevating mechanism 35 is controlled by the controller 16. An on-off valve 38 is disposed on a chemical liquid supply channel 37 that is connected to the chemical liquid nozzle 5. On-off actions of the on-off valve 38 are controlled by the controller 16.

The second support arm 15 is disposed above the wafer W supported by the spin chuck 3. A proximal end of the second support arm 15 is supported to be capable of moving along a guide rail 51 which is substantially horizontally placed. A driving mechanism 52 is disposed for moving the second support arm 15 along the guide rail 51. These members constitute a nozzle moving mechanism that horizontally moves the process liquid nozzle 11, the fluid nozzle 12, and the inert gas nozzle 13. As shown in FIG. 2, along with the movement of the second support arm 15 which is driven by the driving mechanism 52, the process liquid nozzle 11, the fluid nozzle 12, and the inert gas nozzle 13 can horizontally, radially move outside the wafer W relative to the rotational center Po of the wafer W. Driving of the driving mechanism 52 is controlled by the controller 16 (FIG. 1).

As shown in FIG. 1, an elevating mechanism 55 provided with an elevating shaft 54 is fixed on a distal end of the second support arm 15. The elevating shaft 54 extends downward from the elevating mechanism 55. The process liquid nozzle 11, the fluid nozzle 12, and the inert gas nozzle 13 are attached to a lower end of the elevating shaft 54. The elevating shaft 54 is driven by the elevating mechanism 55 to expand and contract, such that the process liquid nozzle 11, the fluid nozzle 12, and the inert gas nozzle 13 are set at a given height. Driving of the elevating mechanism 55 is controlled by the controller 16. That is, based on instructions from the controller 16, driving of the driving mechanism 52 is controlled so as to move the second support arm 15, the fluid nozzle 12, and the inert gas nozzle 13 in the horizontal direction (nozzle moving direction D), while driving of the elevating mechanism 55 is controlled so as to adjust positions of the process liquid nozzle 11, the fluid nozzle 12, and the inert gas nozzle 13 in the vertical direction.

Figure 3:
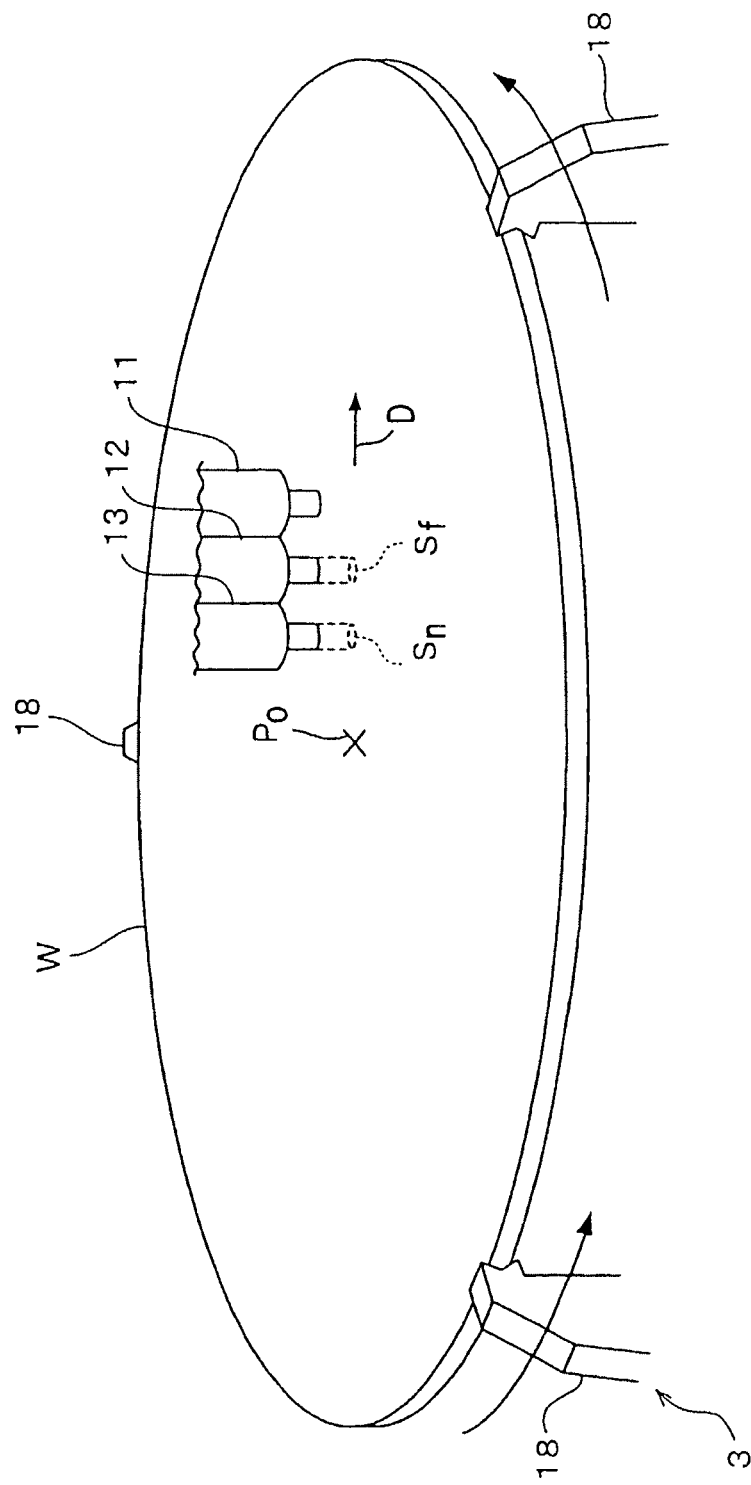
FIG. 3 is a perspective view of assistance in explaining actions of a fluid nozzle and an inert gas nozzle of the substrate processing apparatus shown in FIG. 1.

As shown in FIG. 3, the process liquid nozzle 11, the fluid nozzle 12, and the inert gas nozzle 13 are adjacently aligned in the radial direction (nozzle moving direction D) opposite the chemical liquid nozzle 5 relative to the rotational center Po of the wafer W. That is, in the nozzle moving direction D, the inert gas nozzle 13 is positioned nearer to the rotational center Po of the wafer W than the fluid nozzle 12, and the process liquid nozzle 11 is positioned farther away from the rotational center Po of the wafer W than the fluid nozzle 12.

The process liquid nozzle 11 supplies a liquid such as deionized water (DIW) as a rinse liquid to liquid-process the wafer W. The process liquid nozzle 11 is connected to a rinse liquid supply source 61 through a rinse liquid supply channel 62. An on-off valve 63 is disposed on the rinse liquid supply channel 62. It is preferable to use, as a drying fluid which is supplied from the fluid nozzle 12, an IPA solution in which IPA (isopropyl alcohol) is diluted with a deionized water mixed therein. Mixing of a deionized water to dilute IPA is economically advantageous in that an amount of IPA to be used can be further decreased. The fluid nozzle 12 is connected to a drying fluid supply source 66 through a fluid supply channel 67. An on-off valve 68 is disposed on the fluid supply channel 67. The inert gas nozzle 13 is connected to a nitrogen gas supply source 71 through a nitrogen gas supply channel 72. An on-off valve 73 is disposed on the nitrogen gas supply channel 72. On-off actions of the on-off valves 63, 68, and 73 are controlled by the controller 16 to control supply of a rinse liquid, an IPA solution, and nitrogen gas.

Now, a method for processing a wafer W conducted by the substrate processing apparatus 1 as structured above is described.

First, a wafer, which has not been cleaned yet, is loaded into the process vessel 2 by a transfer arm, not shown, and the wafer W is held by the spin chuck 3 as shown in FIG. 1. In order to deliver the wafer W to the spin chuck 3, as indicated by the two-dot chain lines shown in FIG. 2, the first and second support arms 6 and 15 are previously retracted to standby positions located outside the spin chuck 3.

After the wafer W is held by the spin chuck 3, the spin chuck 3 is driven in rotation by the motor 20 shown in FIG. 1 to start a rotation of the wafer W. Then, a chemical process step is started to process the wafer W by a chemical liquid. First, as indicated by the chain lines shown in FIG. 2, the first support arm 6 is moved such that the chemical liquid nozzle 5 is positioned above the rotational center Po of the rotating wafer W. Then a chemical liquid is supplied from the chemical liquid nozzle 5 toward the rotational center Po of the wafer W. The chemical liquid supplied to the rotational center Po is dispersed over the entire upper surface of the wafer W due to the centrifugal force. Thus, a liquid film of the chemical liquid is formed on the upper surface of the wafer W.

Thereafter, the supply of the chemical liquid from the chemical liquid nozzle 5 is stopped, and the first support arm 6 is returned to the standby position outside the spin chuck 3. Then, by leaving the wafer W as it is for a predetermined period of time, the upper surface of the wafer W is processed by the liquid film of the chemical liquid.

Next, a liquid process step is performed to rinse the wafer W. First, as indicated by the chain lines shown in FIG. 2, the second support arm 15 is moved such that the process liquid nozzle 11 is positioned above the rotational center Po of the wafer W. Then, in order to liquid-process the wafer W, a rinse liquid is supplied from the process liquid nozzle 11 toward the rotational center Po of the wafer W that is rotated at a predetermined rotational speed. The rinse liquid supplied to the rotational center Po is dispersed over the entire surface of the wafer W due to the centrifugal force. Thus, the chemical liquid on the wafer W is washed away to be removed from the upper surface of the wafer W, and a liquid film of the rinse liquid is formed thereon.

After the wafer W is sufficiently rinsed, the supply of the rinse liquid is stopped, and a drying step is started. First, a supply of an IPA solution from the fluid nozzle 12 is started, and a supply of nitrogen gas from the inert gas nozzle 13 is started. Then, the second support arm 15 is moved in the nozzle moving direction D, while continuing to supply the IPA solution and the nitrogen gas from the nozzles 12 and 13 to the upper surface of the rotating wafer W. Thus, as shown in FIG. 3, a supply position Sf of the IPA solution supplied from the fluid nozzle 12 to the upper surface of the wafer, and a supply position Sn of the nitrogen gas supplied from the inert gas nozzle 13 to the upper surface of the wafer, are moved radially outward from the rotational center Po of the wafer W. Since the wafer W is rotated, the upper surface of the wafer W can be entirely sprayed with the IPA solution and the nitrogen gas.

The supply of the IPA solution and the supply of the nitrogen gas may be simultaneously started. For example, by starting the supply of the IPA solution and the nitrogen gas when the fluid nozzle 12 is moved to a position directly above the rotational center Po of the wafer W, the supply of the IPA solution may be started from the rotational center Po of the wafer W, and the supply of the nitrogen gas may be started from a position slightly behind away from the rotational center Po in the nozzle moving direction D. Alternatively, the supply of the nitrogen gas may be started, after starting the supply of the IPA solution, when the inert gas nozzle 13 is moved to a position directly above the rotational center Po of the wafer W, whereby the supply of the nitrogen gas is started from the rotational center Po of the wafer W. Alternatively, the supply of the IPA liquid and the supply of the nitrogen gas may be started at positions slightly behind away from the rotational center Po in the nozzle moving direction D.

By supplying the IPA solution, the rinse liquid adhered to the upper surface of the wafer W is washed away therefrom. The volatility of IPA mixed in the rinse liquid expedites evaporation of the rinse liquid. Thus, the supply of the IPA solution can efficiently remove the deionized water from the upper surface of the wafer W. The IPA solution supplied on the upper surface of the wafer W flows radially outward on the wafer W due to the centrifugal force. While the supply position Sf of the IPA solution is moved in the nozzle moving direction D, the supply position Sn of the nitrogen gas is maintained nearer to the rotational center Po of the wafer W than the adjacent supply position Sf of the IPA solution. Thus, immediately after the rinse liquid on the upper surface of the wafer W is washed away, the nitrogen gas can be supplied thereon to promote drying of the upper surface of the wafer W.

Since the upper surface of the wafer W can be efficiently dried, a drying speed can be accelerated, while moderating the IPA consumption. Further, since an oxidation density causing water marks can be lowered, generation of water marks can be avoided.

When the supply position Sf of the IPA solution reaches a position on a periphery of the wafer W, the supply of the IPA solution from the fluid nozzle 12 is stopped. Similarly, when the supply position Sn of the nitrogen gas reaches a position on the periphery of the wafer W, the supply of the nitrogen gas from the inert gas nozzle 13 is stopped. Then, the drying step is completed. It is possible to temporarily stay the supply position Sn of the nitrogen gas at a position on the periphery of the wafer W to continue for a while the supply of the nitrogen gas onto the periphery, and then stop the supply of the nitrogen gas. In this case, the wafer can be more reliably dried.

After the drying step is finished, the rotation of the spin chuck 3 is stopped, and the not-shown transfer arm is allowed to enter the process vessel 2. The wafer W is delivered from the spin chuck 3 to the transfer arm, and is then unloaded from the process vessel 2. In this manner, a series of processes for the wafer W conducted by the substrate processing apparatus 1 are finished.

For example, a storage medium (magnetic storage medium, optical storage medium, semiconductor memory, and so on) which stores a program configured to execute the above-described substrate processing method may be prepared, and the controller 16 may read the program from the storage medium to execute the same.

As has been described above, in this embodiment, by supplying the IPA solution from the fluid nozzle 12, the process liquid adhered to the wafer W can be efficiently removed therefrom. In addition, by supplying nitrogen gas from the inert gas nozzle 13, the IPA solution on the wafer W can be efficiently removed therefrom. Therefore, by simultaneously supplying the IPA solution and the nitrogen gas, the wafer W can be efficiently dried. Since the use of nitrogen gas can promote drying of the wafer W, the amount of IPA solution to be used can be lowered. Because of the smaller IPA consumption, a reduction in cost can be accomplished. Moreover, since the wafer W can be efficiently dried, a time required for the drying process can be shortened.

Figure 6:
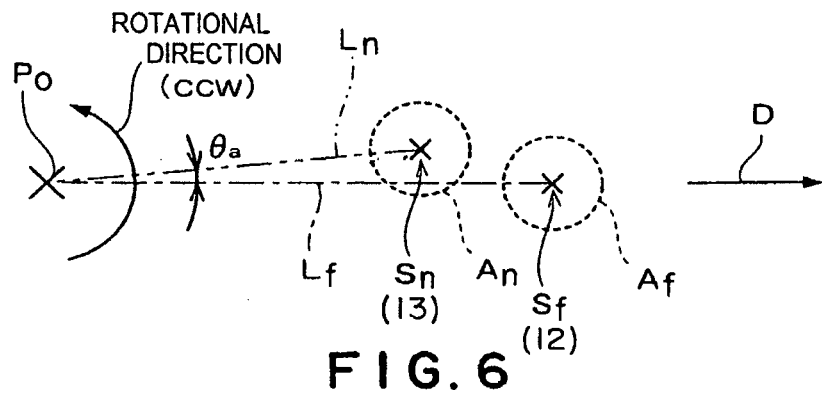
FIG. 6 is a plan view of assistance in explaining an arrangement of a fluid nozzle and an inert gas nozzle of another embodiment of the substrate processing apparatus according to the present invention.

Another embodiment of the present invention shown in FIG. 6 is described below. In this embodiment, the supply position Sn (inert gas nozzle 13) of nitrogen gas to the wafer W is positioned ahead of the supply position Sf (fluid nozzle 12) of an IPA solution to the wafer W, in a rotational direction of the wafer W. In FIG. 6, a supply area of the IPA solution from the nozzle 12 is depicted by a circle Af indicated by the broken line, and a supply area of the nitrogen gas from the nozzle 13 is depicted by a circle An indicated by the broken line. A center point of the supply area Af is represented by the supply position Sf, and a center point of the supply area An is represented by the supply position Sn. A line Lf connects the supply position Sf and the rotational center Po of the wafer W to each other. A line Ln connects the supply position Sn and the rotational center Po of the wafer W to each other. In this case, the line Ln is displaced from the line Lf at an angle θn which is smaller than 90° in the rotational direction of the wafer W. This design enables that the nitrogen gas following the IPA solution is constantly supplied to the wafer W not only in the radial direction of the wafer W but also in the rotational direction thereof.

Figure 7:
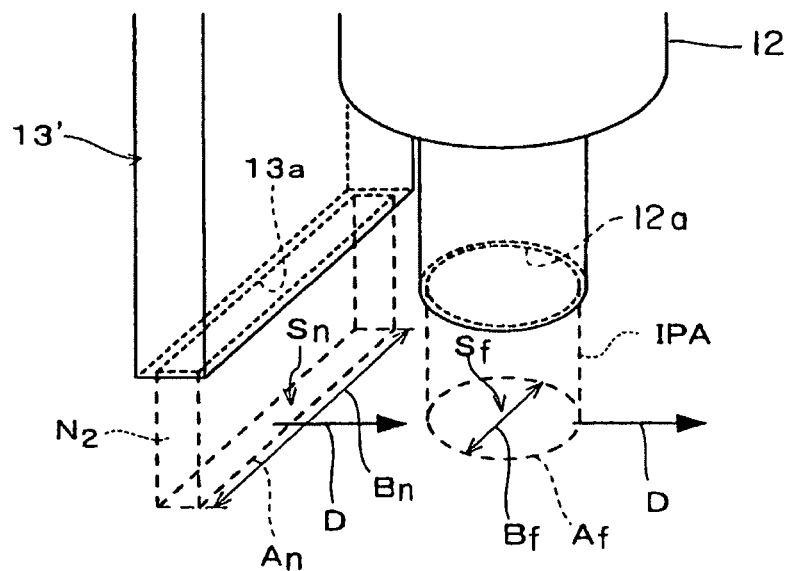
FIG. 7 is a perspective view of assistance in explaining a difference in an opening size (shape) of a fluid nozzle and that of an inert gas nozzle of another embodiment of the substrate processing apparatus according to the present invention.

Another embodiment of the present invention shown in FIG. 7 is described below. In this embodiment, an opening dimension Bn of an inert gas nozzle 13' is larger than an opening dimension Bf of the fluid nozzle 12, in a direction perpendicular to the nozzle moving direction D (herein, the direction is in parallel to the surface of the wafer W). To be specific, the fluid nozzle 12 has a circular opening 12a, while the inert gas nozzle 13' has a rectangular opening 13a whose long side is longer than a diameter of the circular opening 12a. Thus, the dimension Bn of the supply area An of the inert gas is larger than the dimension Bf of the supply area Af of the IPA solution, in the direction perpendicular to the nozzle moving direction D. This design enables that the IPA solution is effectively washed away by the nitrogen gas. Thus, the drying step can be more efficiently performed.

Figure 8:
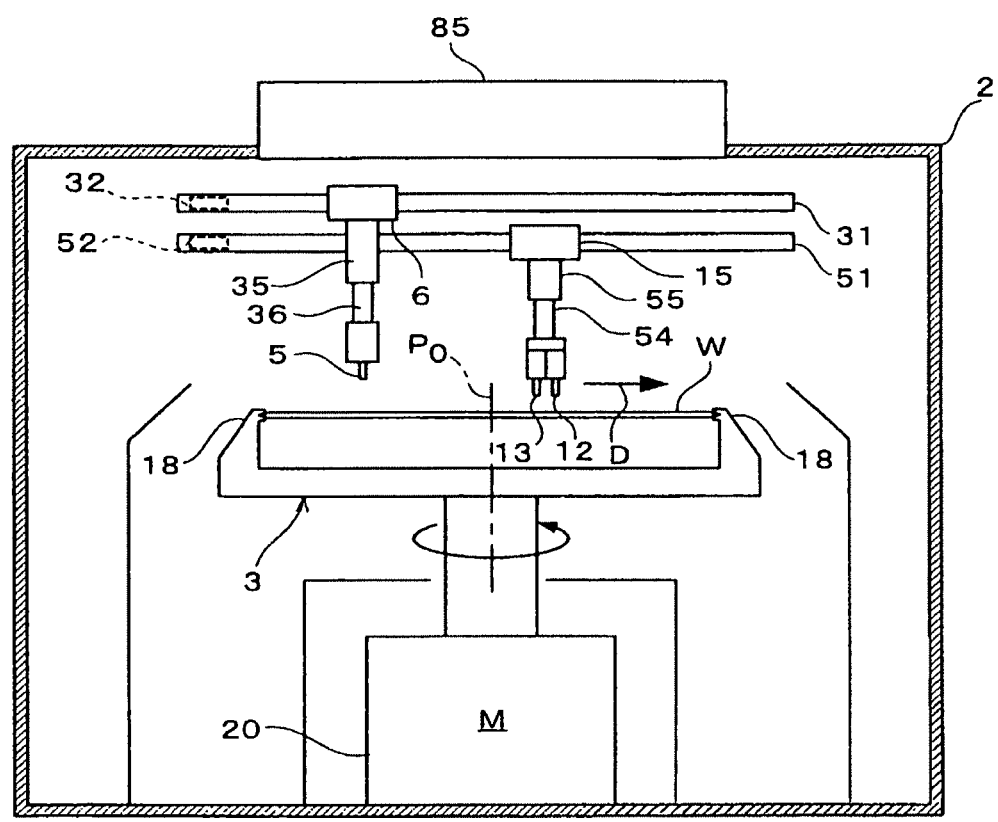
FIG. 8 is a schematic view of another embodiment of the substrate processing apparatus according to the present invention.

Another embodiment of the present invention shown in FIG. 8 is described below. In this embodiment, there is further provided a humidity adjusting mechanism for adjusting a humidity around the wafer W held by the spin chuck 3. As shown in FIG. 8, the humidity adjusting mechanism may be formed by a humidity adjustor 85 disposed on a ceiling of the process vessel 2. Alternatively, the humidity adjusting mechanism may adjust the humidity by evacuating an interior of the process vessel 2 while supplying thereinto a dry inert gas. Owing to the humidity adjusting mechanism, the drying step is performed in such conditions that the humidity around the wafer W is lower (e.g., relative humidity of about 25%) than the humidity at the chemical process step and the liquid process step. This design enables that, when an IPA solution is supplied to the wafer W, the moisture surrounding the wafer W is inhibited from dissolving in the IPA solution. Thus, it is possible to prevent generation of particles on the wafer W that has been subjected to the drying process.

Although the preferred embodiments of the present invention have been described, the present invention is not limited to the above embodiments. For example, not limited to a semiconductor wafer, a substrate may be a glass substrate for an LCD, a CD substrate, a print substrate, a ceramic substrate, and so on.

The method has been described in which the wafer W is processed by a chemical liquid supplied from the chemical liquid nozzle 5, and is then cleaned by a process liquid. However, the method for cleaning the wafer W is not limited thereto. For example, the present invention can be suitably applied to a substrate processing apparatus that cleans a wafer W by rubbing the same with a scriber such as a brush and a sponge. Alternatively, the present invention can be applied to a substrate processing apparatus that performs various other processes, such as a resist removing process and a process for removing etching residues. For example, a nozzle for supplying a chemical liquid that removes a resist may be provided to remove a resist. Following to the resist removing process, the chemical liquid process, the rinse process, and the drying process, described in the above embodiment, may be conducted.

Although an IPA solution made by diluting an IPA liquid with a deionized water is taken as an example of a drying fluid, an undiluted IPA liquid can be used. In addition to a liquid state, the fluid may take an atomized state, a jet-flow state, and a vaporous state. For example, a mist of IPA liquid, a mist of IPA solution, an IPA vapor, or a vapor of IPA solution (mixed vapor in which IPA vapor and water vapor are mixed) may be used as the fluid. Besides, a gas such as nitrogen gas is mixed in a mist of IPA liquid, a mist of IPA solution, a vapor of IPA, or a vapor of IPA solution, and the mixture may be used as the drying fluid. When using an IPA solution or a mist or vapor of IPA solution, the ratio of the IPA liquid to the deionized water in the IPA solution may be 1:1, for example.

In place of the IPA, a solvent having a higher volatility, such as water-solvent alcohols including methanol and ethanol, or acetone may be used, for example. When such a solvent is used as the drying fluid, an amount of the fluid to be used can be decreased according to the present invention, so that costs can be reduced. The drying fluid is preferably soluble in a rinse liquid. In this case, by mixing the drying fluid in a rinse liquid, evaporation of the rinse liquid can be helped. Furthermore, the drying fluid may have a function for reducing a surface tension of the rinse liquid, when the drying fluid is mixed in the rinse liquid. This function facilitates removal of the rinse liquid from a surface of the wafer W. Thus, the rinse liquid can be efficiently removed and the wafer W can be easily dried.

A two-fluid nozzle may be used as the fluid nozzle 12. For example, a liquid, such as an IPA liquid or IPA solution, and a gas, such as nitrogen gas are mixed inside the two-fluid nozzle to form an IPA liquid or IPA solution into a jet-flow of a number of particulate droplets. The droplets are accelerated by the gas and jetted from the tow-fluid nozzle. A structure of the two-fluid nozzle is not limited to an internal mixing type, but may be a structure of an external mixing type in which a liquid and a gas are mixed outside.

Although there has been described the process in which a rinse liquid is supplied to the wafer W from the process liquid nozzle 11, then the supply of the rinse liquid is stopped, and thereafter an IPA solution and nitrogen gas are supplied to carry out a drying process, the present invention is not limited thereto. For example, as in another embodiment shown in FIG. 4, an IPA solution and nitrogen gas may be supplied, while supplying a rinse liquid. That is, the second support arm 15 may be moved in the nozzle moving direction D, while a rinse liquid, an IPA solution, and nitrogen gas are simultaneously supplied from the process liquid nozzle 11, the fluid nozzle 12, and the inert gas nozzle 13, respectively. Thus, the supply position Sr of the rinse liquid, the supply position Sf of the IPA solution, and the supply position Sn of the nitrogen gas may be simultaneously moved on the upper surface of the wafer W in the nozzle moving direction D.

Figure 4:
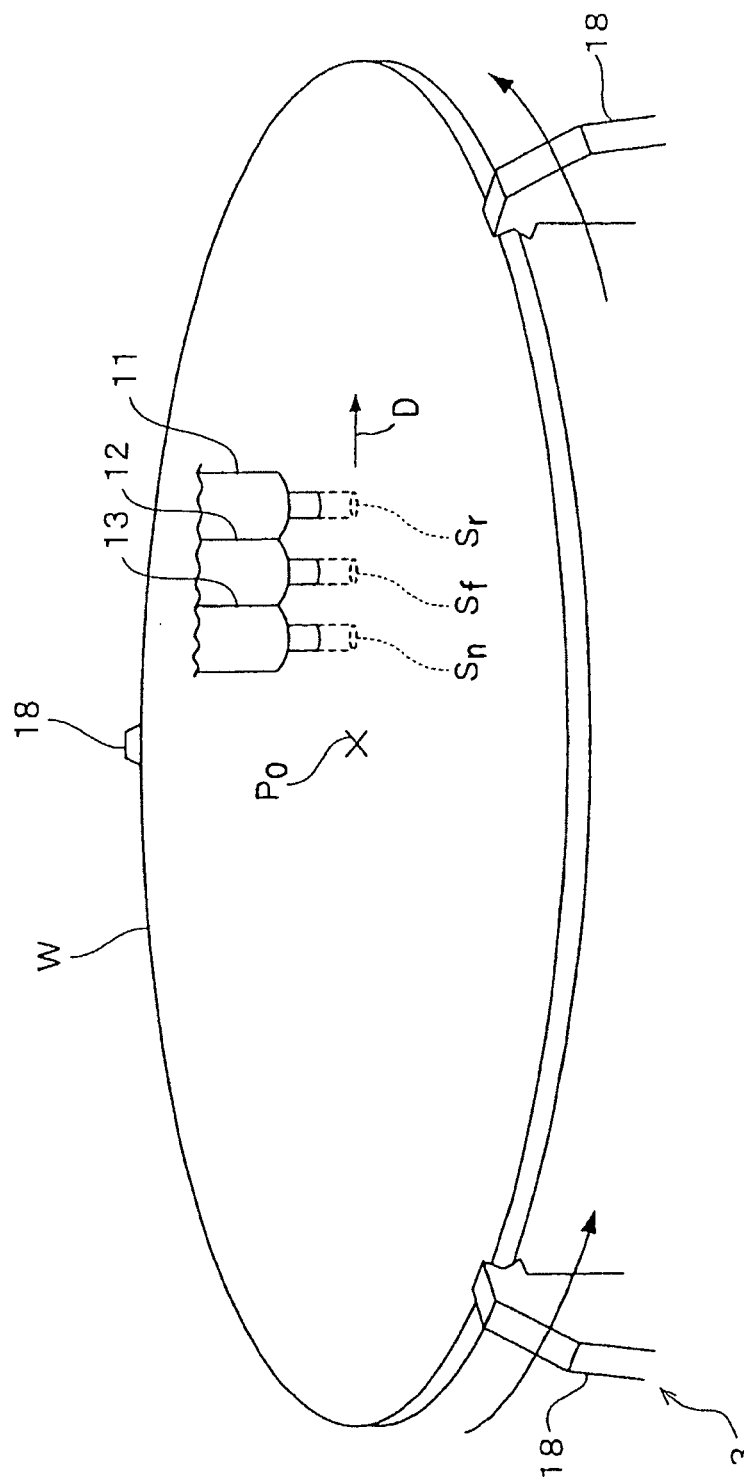
FIG. 4 is a perspective view of assistance in explaining actions of a process liquid nozzle, a fluid nozzle, and an inert gas nozzle of another embodiment of the substrate processing apparatus according to the present invention.

In the embodiment shown in FIG. 4, the rinse liquid supplied to the upper surface of the wafer W flows radially outward due to the centrifugal force. The IPA solution supplied to the position Sf adjacent to the supply position Sr of the rinse liquid washes away the rinse liquid. Thus, even when the chemical liquid remains on the upper surface of the wafer W, the remaining chemical liquid can be efficiently washed away by the rinse liquid and the IPA solution. In addition, before the rinse liquid is removed from the upper surface of the wafer W, i.e., before the surface of the wafer W is exposed, the rinse liquid is promptly replaced by the IPA solution supplied to the supply position Sf. Namely, since the supply of the IPA solution efficiently removes the rinse liquid from the upper surface of the wafer W, generation of water marks can be decreased. Further, the nitrogen gas supplied to the supply position Sn promotes drying of the IPA solution. Consequently, also in this embodiment, the upper surface of the wafer W can be efficiently dried. As described above, the simultaneous supply of the rinse liquid, the IPA solution, and the nitrogen gas makes it possible to successively rinse and dry the wafer W radially outward from the rotational center Po thereof. This structure can shorten a time required for the drying process.

The process liquid nozzle 11, the fluid nozzle 12, and the inert gas nozzle 13 are supported by the single second support arm 15. However, the nozzles 11, 12, and 13 may be supported by separate support arms. In this case, the process liquid nozzle 11, the fluid nozzle 12, and the inert gas nozzle 13 may be radially moved in different directions.

Figure 5:
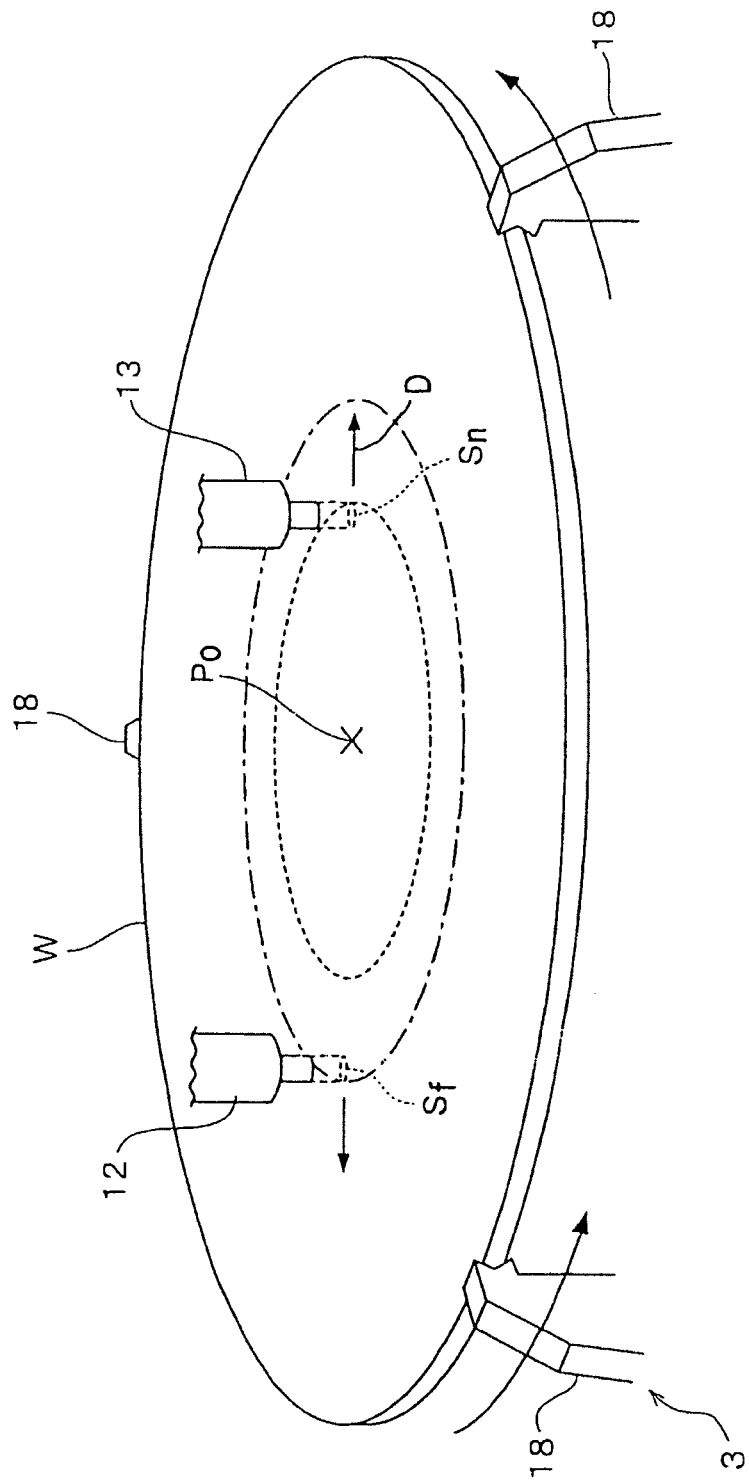
FIG. 5 is a perspective view of assistance in explaining actions of a fluid nozzle and an inert gas nozzle of another embodiment of the substrate processing apparatus according to the present invention.

For example, there are separately disposed a support arm for supporting the fluid nozzle 12 and a support arm for supporting the inert gas nozzle 13. At the drying process, the respective support arms are radially moved in different directions at an angle of 180° by a control of the controller 16. Thus, as shown in FIG. 5, the fluid nozzle 12 and the inert gas nozzle 13 are moved radially outward in different directions at an angle of 180° from the rotational center Po of the wafer W. Also in this case, the supply position Sn of the nitrogen gas is maintained at a position nearer to the rotational center Po of the wafer W than the supply position Sf of the IPA solution. That is, a distance between the supply position Sn of the nitrogen gas and the rotational center Po is controlled to be constantly shorter than a distance between the supply position Sf of the IPA solution and the rotational center Po.

Also in this case, when the wafer is rotated to move the IPA solution which has been supplied at the supply position Sf on the upper surface of the wafer W toward the supply position Sn of the nitrogen gas, the IPA solution is blown off toward an outer periphery of the wafer W by the nitrogen gas supplied from the side of the rotational center Po, so that the wafer is dried. Therefore, the wafer W can be efficiently dried. Alternatively, by separately providing a support arm for supporting the process liquid nozzle 11, the support arm may be moved radially outward such that the supply position Sr of the rinse liquid is maintained farther away from the rotational center Po of the wafer W than the supply position Sf of the IPA solution. In this case, the supply position Sr of the rinse liquid may be aligned with the supply position Sf of the IPA solution in the same radial direction.

The invention claimed is:

1. A substrate processing method comprising:
   a liquid-processing step of processing a substrate with deionized water; and
   a drying step of drying the substrate, wetted with the deionized water supplied in the liquid-processing step, by supplying a drying fluid and an inert gas to the substrate, while rotating the substrate with the deionized water adhering thereto due to execution of the liquid-processing step, the drying fluid having a higher volatility than that of the deionized water, wherein
   in the drying step, a supply position of the drying fluid to the substrate and a supply position of the inert gas to the substrate are moved radially outward from a rotational center of the substrate to a periphery of the substrate, respectively, while both the drying fluid and the inert gas are supplied to the substrate at the same time and while the supply position of the inert gas is maintained nearer to the rotational center of the substrate than the supply position of the drying fluid.

2. The substrate processing method according to claim 1, wherein
   the liquid-processing step and the drying step are successively performed radially outward relative to the rotational center of the substrate, by supplying the deionized water to the substrate while moving a supply position of the deionized water to the substrate radially outward from the rotational center of the substrate to the periphery of the substrate, with maintaining the supply position of the deionized water farther away from the rotational center of the substrate than the supply position of the drying fluid to the substrate.

3. The substrate processing method according to claim 1, wherein
   the supply position of the inert gas to the substrate is positioned ahead of the supply position of the drying fluid to the substrate, in a rotational direction of the substrate.

4. The substrate processing method according to claim 1, wherein
the drying step is performed under conditions that a humidity around the substrate is lower than that at the liquid-processing step.

5. The substrate processing method according to claim 1, wherein
the drying fluid is selected from the group consisting of an IPA liquid, an IPA solution diluted with water, a mist of IPA liquid, a mist of IPA solution diluted with water, an IPA vapor, and a vapor of IPA solution diluted with water.

6. The substrate processing method according to claim 1, wherein, in the drying step, the supply position of the drying fluid and the supply position of the inert gas are moved in different directions.

7. The substrate processing method according to claim 6, wherein the different directions are opposite directions.

* * * * *